United States Patent
Adachi et al.

(10) Patent No.: US 9,161,482 B2
(45) Date of Patent: Oct. 13, 2015

(54) SHIELD TERMINAL CONNECTION STRUCTURE AND METHOD

(75) Inventors: Hideomi Adachi, Kosai (JP); Hidehiko Kuboshima, Kosai (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 13/703,135

(22) PCT Filed: Jun. 9, 2011

(86) PCT No.: PCT/JP2011/063296
§ 371 (c)(1),
(2), (4) Date: Dec. 10, 2012

(87) PCT Pub. No.: WO2011/155581
PCT Pub. Date: Dec. 15, 2011

(65) Prior Publication Data
US 2013/0087377 A1 Apr. 11, 2013

(30) Foreign Application Priority Data

Jun. 10, 2010 (JP) ................. 2010-132585

(51) Int. Cl.
*H01R 13/648* (2006.01)
*H05K 9/00* (2006.01)
*H01R 13/74* (2006.01)

(52) U.S. Cl.
CPC ............ *H05K 9/0007* (2013.01); *H01R 13/648* (2013.01); *H01R 13/748* (2013.01); *H05K 9/0018* (2013.01); *H05K 9/0098* (2013.01); *Y10T 29/49117* (2015.01)

(58) Field of Classification Search
CPC ... H05K 9/0018; H01R 13/748; H01R 13/648
USPC ......................................... 174/376, 359, 360
See application file for complete search history.

(56) References Cited

U.S. PATENT DOCUMENTS

| 5,401,177 A * | 3/1995 | Dutton et al. .................... 439/98 |
| 6,674,005 B2 | 1/2004 | Yagi et al. |
| 6,680,433 B2 | 1/2004 | Hashizawa et al. |
| 6,793,532 B2 * | 9/2004 | Saito et al. ............... 439/607.41 |

(Continued)

FOREIGN PATENT DOCUMENTS

| CN | 101437388 A | 5/2009 |
| JP | 2002218640 A | 8/2002 |

(Continued)

OTHER PUBLICATIONS

Search Report dated Sep. 23, 2013, issued by the European Patent Office in counterpart European Application No. 11792538.8.

(Continued)

*Primary Examiner* — Hung V Ngo
(74) *Attorney, Agent, or Firm* — Sughrue Mion, PLLC

(57) ABSTRACT

Provide is a shield terminal connection structure and method, which are easy and simple, for connecting a terminal part of a tubular shielding member to a shield structure. A holding part is formed by a terminal part itself of a shielding member, and then, a fixing member held by the holding part is connected to one side wall of a shield casing. When the fixing member is fixed to the one side wall of the shield casing, electrical connection to the shield member is also completed at the same time of the fixing.

15 Claims, 8 Drawing Sheets

(56) References Cited

U.S. PATENT DOCUMENTS

| | | | |
|---|---|---|---|
| 7,041,907 B2 * | 5/2006 | Miyazaki | 174/72 A |
| 7,094,970 B2 | 8/2006 | Kihira | |
| 7,331,823 B2 | 2/2008 | Fukushima et al. | |
| 2002/0094724 A1 | 7/2002 | Saito et al. | |
| 2002/0134565 A1 | 9/2002 | Hashizawa et al. | |
| 2003/0024717 A1 * | 2/2003 | Knighten et al. | 174/35 R |
| 2003/0062177 A1 | 4/2003 | Yagi et al. | |
| 2003/0221850 A1 * | 12/2003 | Mizutani | 174/36 |
| 2004/0099427 A1 | 5/2004 | Kihira | |
| 2005/0266729 A1 | 12/2005 | Fukushima et al. | |
| 2009/0126985 A1 | 5/2009 | Aoki et al. | |
| 2013/0056256 A1 * | 3/2013 | Guillanton et al. | 174/359 |

FOREIGN PATENT DOCUMENTS

| | | | |
|---|---|---|---|
| JP | 2003115223 A | 4/2003 | |
| JP | 2004171952 A | 6/2004 | |
| JP | 2007-234422 A | 9/2007 | |
| JP | 2007234422 A | 9/2007 | |
| JP | 2010140757 A | 6/2010 | |

OTHER PUBLICATIONS

International Search Report dated Jul. 12, 2011 from the International Searching Authority in counterpart application No. PCT/JP2011/063296.

Written Opinion dated Jul. 12, 2011 from the International Searching Authority in counterpart application No. PCT/JP2011/063296.

Office Action, dated Feb. 13, 2014, issued by the Japanese Patent Office in counterpart Japanese Application No. 2010-132585.

Office Action and Search Report dated Sep. 17, 2014, issued by the State Intellectual Property Office of the People's Republic of China in counterpart Chinese Application No. 201180028570.6.

Office Action dated May 28, 2015, issued by the State Intellectual Property Office of the People's Republic of China in counterpart Chinese Application No. 201180028570.6.

* cited by examiner

FIG.2
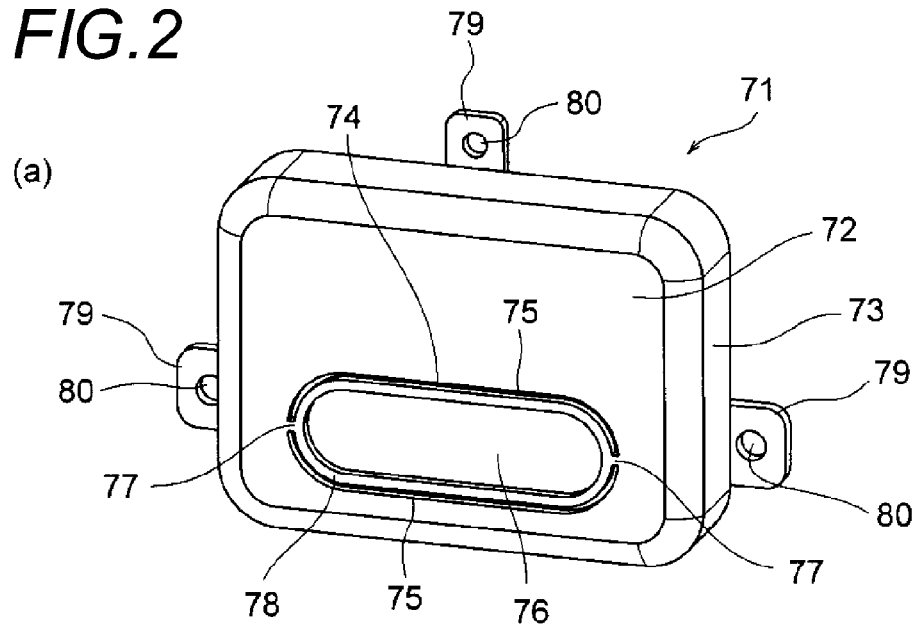
(a)
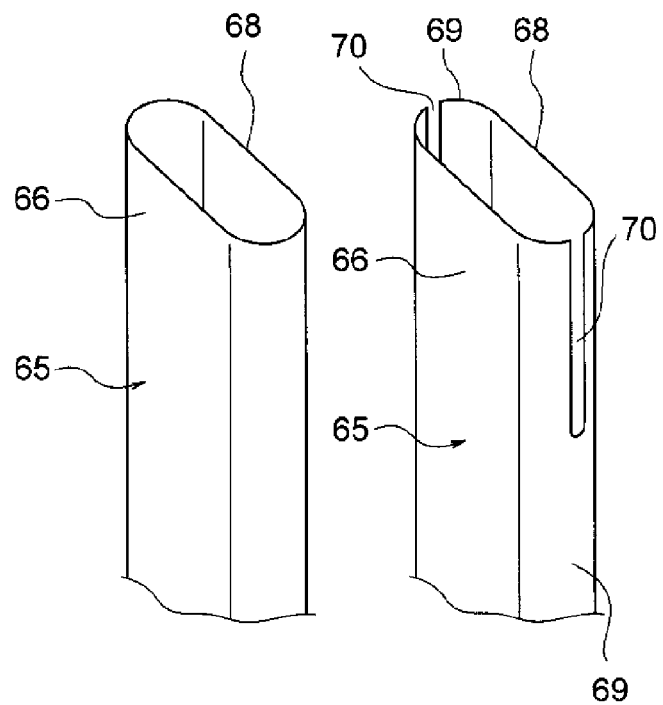
(b)　(c)

SHIELD TERMINAL CONNECTION STRUCTURE AND METHOD

TECHNICAL FIELD

The present invention relates to a shield terminal connection structure and a shield terminal connecting method for connecting a terminal part of a tubular shielding member, which accommodates a plurality of conduction paths collectively, to a shield structure.

BACKGROUND ART

It is known that, in an electric vehicle or a hybrid vehicle, electromagnetic waves will occur from electric wires of a large current and a high voltage which are connected to a mounted motor. Therefore, it is important to take electromagnetic wave shielding measures which can prevent the influence of the electromagnetic waves and also can prevent the influence of electromagnetic waves from outside. Patent Literature 1 discloses an example of the electromagnetic wave shielding measures. Next, the electromagnetic wave shielding measure is described.

In FIG. 8, a reference numeral 1 shows a braid (shielding member) which is formed in a tubular shape by braiding conductive metal wires. A plurality of electric wires 2 are inserted into the inside of the braid 1. The plurality of electric wires 2 are collectively covered with the braid 1. The plurality of electric wires 2, for example, are inserted into a hole 4 which is formed in a shield casing 3 (shield structure) of a motor. The shield casing 3 is a metal casing member which has conductivity. A shielding shell 5 has conductivity, and is fixed to the shield casing 3. A terminal part of the braid 1 and the shielding shell 5 are fixed when a crimp ring 6 is crimped.

CITATION LIST

Patent Literature

Patent Literature 1: JP-A-2003-115223

SUMMARY OF INVENTION

Technical Problem

The terminal part of the braid 1 is inserted into a predetermined position of the shielding shell 5, and is pressed against the shielding shell 5 when the crimp ring 6 is crimped. Then, by fixing the shielding shell 5 to the shield casing 3, the braid 1 is electrically connected to the shield casing 3. Therefore, in the connecting of the braid 1, there is a problem that the connecting is time-consuming, and there is a problem that the number of components is large.

The present invention is made in view of the above-mentioned situations, and an object of the invention is to provide a shield terminal connection structure and a shield terminal connecting method, which are easy and simple, for connecting a terminal part of a tubular shielding member to a shield structure.

Solution to Problem

The above problem found in the present invention is solved with the following configurations.

(1) A shield terminal connection structure, including: a terminal part of a tubular shielding member which accommodates a plurality of conduction paths collectively, the terminal part itself forming a holding part; and a conductive fixing member which is fixed to a shield structure of a connection party to which the conduction paths are connected, wherein the conductive fixing member is electrically contacted with and held to the holding part.

(2) The shield terminal connection structure according to the configuration (1), wherein the holding part is formed by bending the terminal part in an axial direction of the shielding member.

(3) The shield terminal connection structure according to the configuration (2), wherein the terminal part is bent inwards.

(4) The shield terminal connection structure according to the configuration (2) or (3), wherein the holding part is formed by bending the terminal part in a generally bag-like shape and fixing the terminal part so that a bag mouth part of the generally bag-like shape is partly or totally closed.

(5) A shield terminal connection method, including: forming a holding part with a terminal part itself of a tubular shielding member which accommodates a plurality of conduction paths; causing a conductive fixing member to be electrically contacted with and held to the holding part; and then, fixing the conductive fixing member to a shield structure of a connection party to which the conduction paths are connected.

According to the shield terminal connection structure of the above configuration (1), what is necessary is just to use the holding part which the terminal part itself forms and the conductive fixing member which is held to the holding part, when the terminal part of the shielding member is connected to the shield structure. When the fixing member is fixed to the shield structure, the terminal part of the shielding member will be electrically connected to the shield structure via the fixing member at the same time of this fixing. Thus, an effect is achieved that an easy and simple shield terminal connection structure for connecting the terminal part of the shielding member to the shield structure can be provided.

According to the shield terminal connection structure of the above configuration (2), in addition to the effect of the above configuration (1), an effect is achieved that the holding part can be simply formed.

According to the shield terminal connection structure of the above configuration (3), when the holding part is formed at the terminal part of the shielding member, it is possible to bend the terminal part inwards or bend the terminal part outwards. When the terminal part is bent inwards, the terminal part of the shielding member is finished with a cut state, for example. That is to say, in particular, the shielding member may be used without performing additional processes. Thus, in addition to the effect of the above configuration (2), an effect is achieved that it is not necessary to perform additional processes on the terminal of the shielding member.

According to the shield terminal connection structure of the above configuration (4), if the fixing is performed so that while the holding part is formed in a generally bag-like shape, the bag mouth is partly or totally closed, the fixing member will be reliably held. The closing methods of the bag mouth part may include welding such as seam welding or spot welding, contact bonding such as heat contact bonding, and the use of closing members such as a stapler or a tape, which are mentioned as main examples. Thus, in addition to the effects of the above configurations (2) or (3), an effect is achieved that the fixing member can be reliably held.

According to the shield terminal connecting method of the above configuration (5), because only operations of holding the fixing member by forming the holding part at the terminal part of the shielding member and fixing the fixing member to the shield structure are needed, the operability related to the connecting is improved. Thus, an effect is achieved that an easy and simple shield terminal connecting method for connecting the terminal part of the shielding member to the shield structure can be provided.

BRIEF DESCRIPTION OF DRAWINGS

In FIG. 2, (a) is a perspective view of a fixing member, and (b) and (c) are perspective views which show the terminal part of the shielding member.

MODES FOR CARRYING OUT INVENTION

A shield terminal connection structure and method according to one embodiment of the invention is a connection structure and method in which a terminal part of a shielding member itself forms a holding part, and the holding part is fixed to a shield structure by holding a conductive fixing member to the holding part.

First Embodiment

Figure 1:
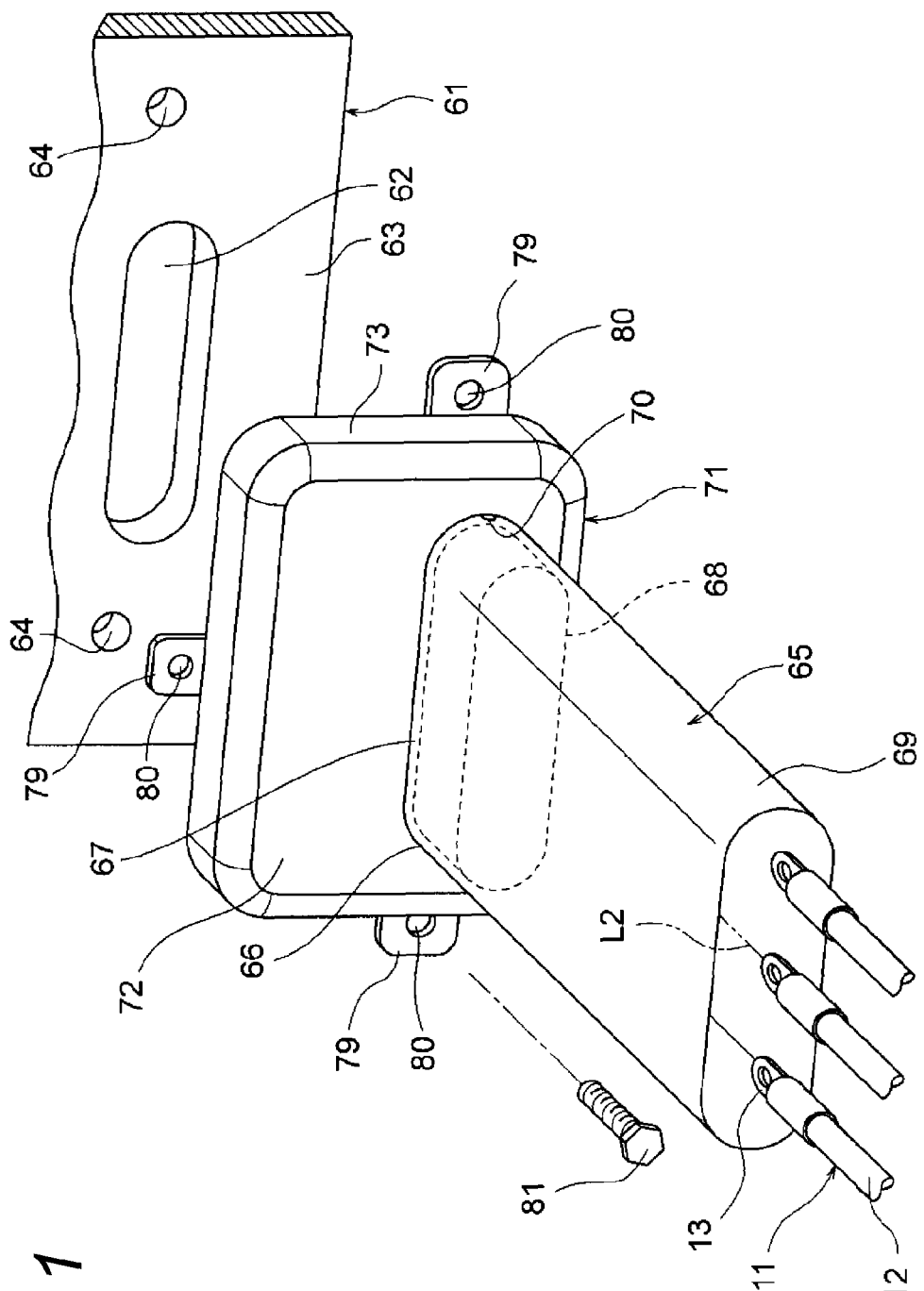
FIG. 1 is a diagram which shows a shield terminal connection structure according to the present invention, and is an exploded perspective view of a terminal part of a shielding member and a shield casing (shield structure) (a first embodiment).

Next, a first embodiment is described with reference to the figures. FIG. 1 is a diagram which shows a shield terminal connection structure according to the present invention, and is an exploded perspective view of a terminal part of a shielding member and a shield casing. FIG. 2(a) is a perspective view of a fixing member, and FIGS. 2(b) and 2(c) are perspective views which show the terminal part of the shielding member. First, component members are described.

In FIG. 1, a reference numeral 11 indicates a high voltage conduction path. The conduction path 11 is not particularly limited, but is provided in order to connect a motor and an inverter which are mounted in an electric vehicle or a hybrid car. In this example, three conduction paths are included. The conduction path 11 includes an insulative wire core 12 which contains a conductor and a cover made of an insulator, and a terminal 13 which is provided at an end of the insulative wire core 12. The conductor of the embodiment is made of copper, copper alloy, or aluminum. The conductor may be either a conductor structure in which wires are twisted or a rod-like conductor structure whose cross section is a rectangular shape or a round shape (for example, conductor structure with a rectangular single core or a round single core). A bus bar may be used instead of the insulative wire core 12. The terminal of the conduction path 11 is not limited to what is shown in the figure, but may have the structure of a known connector. For example, the terminal of the conduction path 11 is adapted to be inserted into, for example, a hole 62 which is formed on a shield casing 61 (shield structure) of an inverter, which becomes a connection party.

The shield casing 61 is a metal casing member which is conductive, and has such a structure that the inverter can be accommodated inside. The hole 62 is formed so that one side wall 63 of the shield casing 61 is penetrated. The hole 62 is formed to have an ellipse shape in this embodiment. A plurality of bolt holes 64 are formed near the hole 62 (three are formed in this embodiment).

A reference numeral 65 indicates a shielding member. The shielding member 65 is formed in a tubular shape with which the three conduction paths 11 can be covered collectively. The shielding member 65 is a member for taking electromagnetic wave shielding measures, and is formed so that a substantially overall length of the conduction path 11 can be covered.

The shielding member 65 may be formed of a braid, or may be formed of a metal foil. The material and the shape of the shielding member 65 are not particularly limited as long as the electromagnetic wave shielding measures can be taken and a holding part 67 can be formed at a terminal part 66.

The shielding member 65 is formed in a tubular shape which has an ellipse cross section. The shielding member 65 is so formed that the lengths of the shielding member 65 in the major axis direction and in the minor axis direction corresponds to the lengths of a held part 74 in a fixing member 71 which will be described later.

The above-mentioned holding part 67 is formed by bending an end 68 in the terminal part 66 of the shielding member 65 in the direction of an axis L2 of the shielding member 65. In this embodiment, the holding part 67 is formed by bending the end 68 inwards (alternatively, the holding part 67 may be formed by bending the end 68 outwards). The holding part 67 is formed in a generally two-folded bag-like shape. The holding part 67 has slits 70 (refer to FIG. 2(c)) at two side parts 69 in the major axis direction. The slits 70 are formed as parts used when the fixing member 71 described later is held.

In FIGS. 1 and 2(a), the fixing member 71 is a metal member which is conductive, and is formed in a generally casing-like shape which has a ceiling wall 72 and side walls 73. The ceiling wall 72 is formed to be opposite to one side wall 63 of the shield casing 61 with a predetermined interval from the side wall 63. A part which is held to the holding part 67 of the shielding member 65 is formed at a predetermined position of the ceiling wall 72. That is, the held part 74 is formed.

The held part 74 includes a pair of first penetrated held parts 75 where the ceiling wall 72 is penetrated, a second penetrated held part 76 where the ceiling wall 72 is also penetrated, and a pair of bridge parts 77 and a frame part 78 which are generated with the forming of the pair of first penetrated held parts 75 and the second penetrated held parts 76.

The second penetrated held part 76 is formed so that the ceiling wall 72 is penetrated in an ellipse shape. The frame part 78 is arranged and formed outside the second penetrated held part 76. The pair of first penetrated held parts 75 and the pair of bridge parts 77 are arranged and formed outside the frame part 78. The pair of first penetrated held parts 75 are formed in a long and thin penetrated shape in conformity with the thickness of the shielding member 65. The pair of bridge parts 77 are adapted to be inserted into the slits 70 of the shielding member 65. The second penetrated held part 76 are formed as a part through which the end 68 passes when the terminal part 66 of the shielding member 65 is bent inwards, and a part into which the three conduction paths 11 are inserted. The frame part 78 is formed as a part which is held to the holding part 67 of the shielding member 65.

A plurality of bolt detents 79 are formed onto the side walls 73. The bolt detents 79 are arranged and formed in conformity with the positions of the bolt holes 64 of the shield casing 61. Bolt through-holes 80 where bolts are inserted, are formed by penetrating the bolt detents 79.

When a bolt 81 for fixing is inserted into the through-hole 80 and screwed to the bolt hole 64, the bolt detent 79 will be fixed to the side wall 63 of the shield casing 61. The side wall 73 and the bolt detent 79 will contact the side wall 63 of the shield casing 61.

Next, the procedures of processing the terminal are described. In the description, the shielding member 65 itself may be formed of a braid or may be formed of a metal foil.

In a first procedure shown in FIG. 2(*b*), the shielding member 65 has conductivity and is formed in a tubular shape. After the shielding member 65 is formed in a tubular shape, the shielding member 65 is formed by being cut into a predetermined length in the longitudinal direction. In FIG. 2(*b*), with the above-mentioned cutting, the end 68 of the shielding member 65 is kept in a cut state (no additional processes).

In a second procedure shown in FIG. 2(*c*), the slits 70 are formed at the two side parts 69 of the shielding member 65. The slits 70 are formed by being cut from the end 68 to a predetermined position. In a third procedure, the terminal part 66 of the shielding member 65 which has the slits 70 is inserted into the first penetrated held parts 75 and the bridge parts 77 of the fixing member 71 shown in FIG. 2(*a*), and is bent inwards to hide the end 68. With this bending, the holding part 67 shown in FIG. 1 is formed at the terminal part 66. Since the holding part 67 is formed in a generally two-folded bag-like shape, the frame part 78 of the fixing member 71 is held in an undropped state.

After the terminal part 66 is bent inwards, if the terminal part 66 is fixed so that the two-folded part near the end 68 (bag mouth part which is formed at the mouth of the bag when the generally bag-like shape is formed) is partly or totally closed, it will become possible to prevent the dropping of the fixing member 71 more reliably. When the shielding member 65 is formed of a braid, the closing methods may include welding such as seam welding or spot welding, contact bonding such as heat contact bonding, and the use of closing members (stapler), which are mentioned as preferable examples. When the shielding member 65 is formed of a metal foil, the closing methods may include adhesion with adhesive and the use of closing members (stapler or tape), which are mentioned as preferable examples.

After the above terminal processes, when the fixing member 71 is fixed to the side wall 63 of the shield casing 61, electric connection of the shielding member 65 will also be completed with this fixing.

Figure 8:
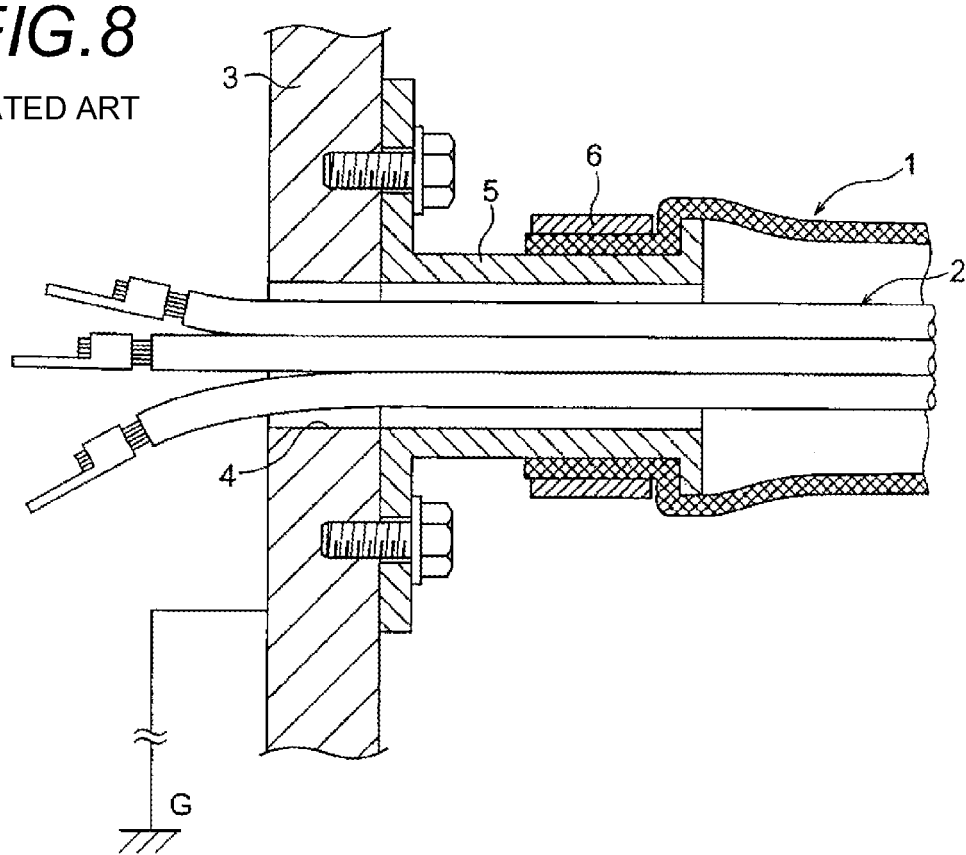
FIG. 8 is a cross sectional view which shows an example of a shield terminal connection structure in a related art.

According to the first embodiment, since the terminal part 66 of the shielding member 65 itself forms the holding part 67, and the fixing member 71 which is held to the holding part 67 is connected to the shield casing 61, an effect is achieved that a shield terminal connection structure and a shield terminal connecting method, which are simple, can be provided. Therefore, an effect is achieved that the problems of the conventional example are solved. That is, in the related art example, as shown in FIG. 8, the terminal part of the braid 1 is inserted into the predetermined position of the shielding shell 5, the shielding shell 5 is pressed with the crimping of the crimp ring 6, and then the shielding shell 5 is fixed to the shield casing 3. Therefore, in the connecting of the braid 1, there is a problem that the connection is time-consuming, and there is a problem that the number of components is large. However, according to the present invention, it can be found from the description of FIGS. 1 to 2(*e*), since the shield terminal connection structure and the shield terminal connecting method are simple, an effect is achieved that the above-mentioned problems can be solved.

Second Embodiment

Figure 3:
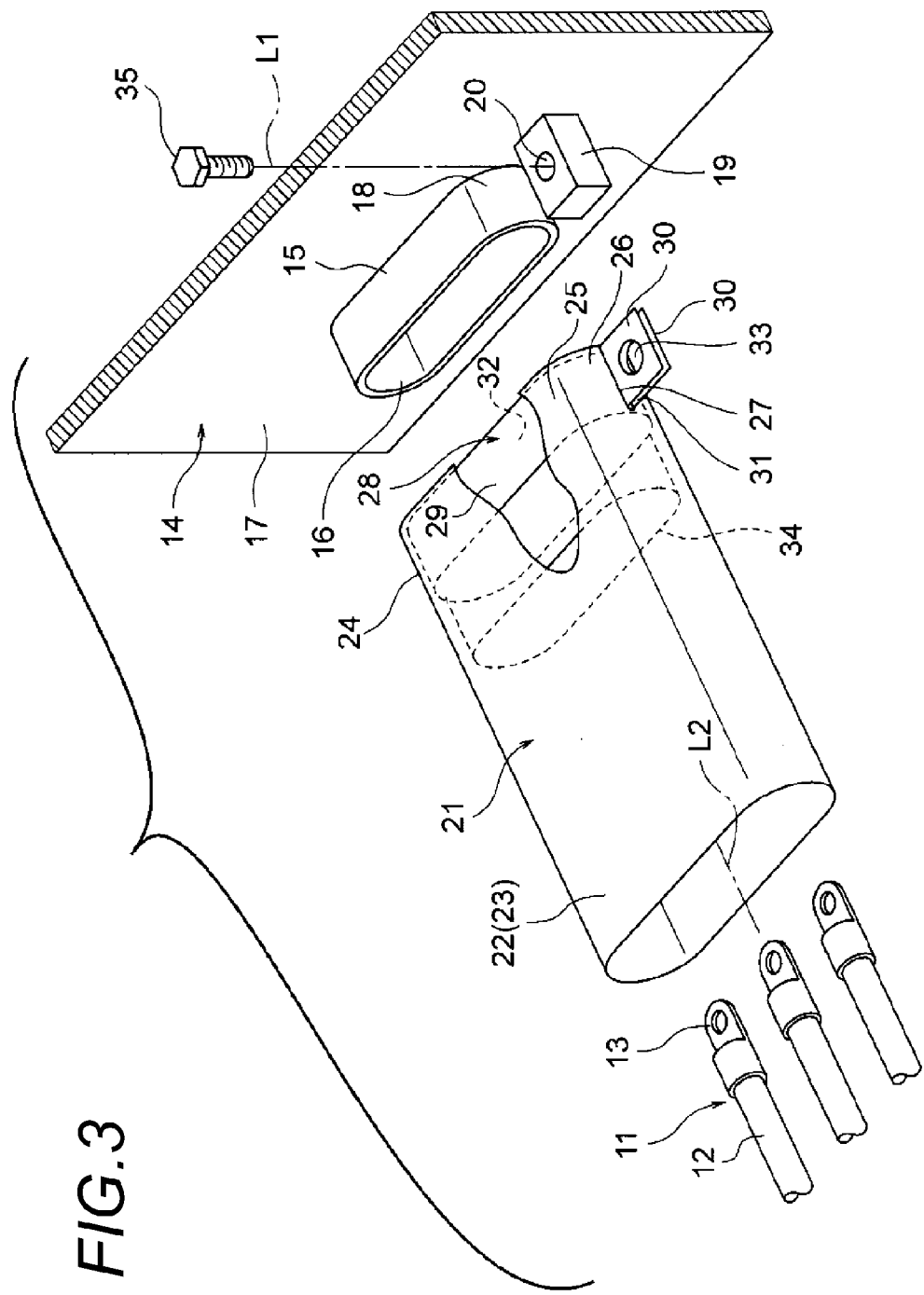
FIG. 3 is a diagram which shows another example of a shield terminal connection structure according to the present invention, and is an exploded perspective view of a terminal part of a shielding member and a shield casing (shield structure) (a second embodiment).
Figure 4:
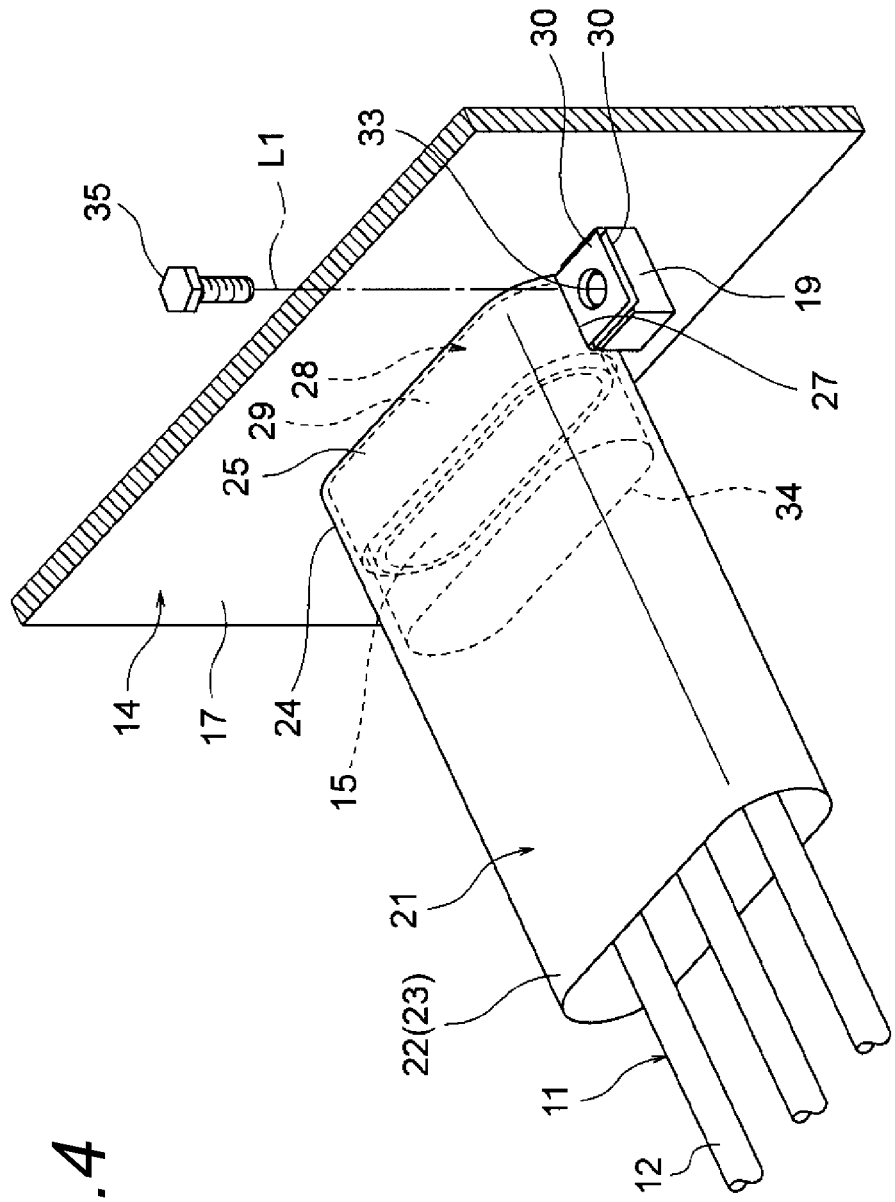
FIG. 4 is a perspective view which shows that the terminal part of the shielding member is being connected to the shield casing.

Next, a second embodiment is described with reference to the figures. FIG. 3 is a diagram which shows another example of a shield terminal connection structure according to the present invention, and is an exploded perspective view of a terminal part of a shielding member and a shield casing. FIG. 4 is a perspective view which shows that the terminal part of the shielding member is being connected to the shield casing, and FIGS. 5(*a*) to 6(*e*) are diagrams which show the process of forming a holding part at the terminal part of the shielding member and holding a clamping and fixing member. First, component members are described.

In FIG. 3, a reference numeral 11 indicates a high voltage conduction path. The conduction path 11 is not particularly limited, but is provided in order to connect a motor and an inverter which are carried in an electric vehicle or a hybrid car. In this example, three conduction paths are included. The same conduction path 11 as that in the first embodiment is used. For example, the terminal of the conduction path 11 is adapted to be inserted into, for example, a hole 16 of a tubular part 15 which is formed on a shield casing 14 (shield structure) of an inverter, which becomes a connection party.

The shield casing 14 is a metal casing member which is conductive, and has such a structure that the inverter can be accommodated inside. The tubular part 15 is formed to be protruded from one side wall 17 of the shield casing 14 for a predetermined length. The tubular part 15 is formed to have an ellipse cross section in this embodiment. A bolt fastening base 19 is formed by being protruded near one side part 18 of the tubular part 15 in the major axis direction. The bolt fastening base 19 is formed in a rectangular block-like shape as shown in the figure, for example. The bolt fastening base 19 has a bolt hole 20 whose axis L1 is parallel to the wall surface of the side wall 17. The tubular part 15 and the bolt fastening base 19 are integrally formed on the side wall 17, and naturally have conductivity.

A reference numeral 21 indicates a shielding member. The shielding member 21 is formed in a tubular shape with which the three conduction paths 11 can be covered collectively. The shielding member 21 is a member for taking electromagnetic wave shielding measures, and is formed so that a substantially overall length of the conduction path 11 can be covered.

Figure 5:
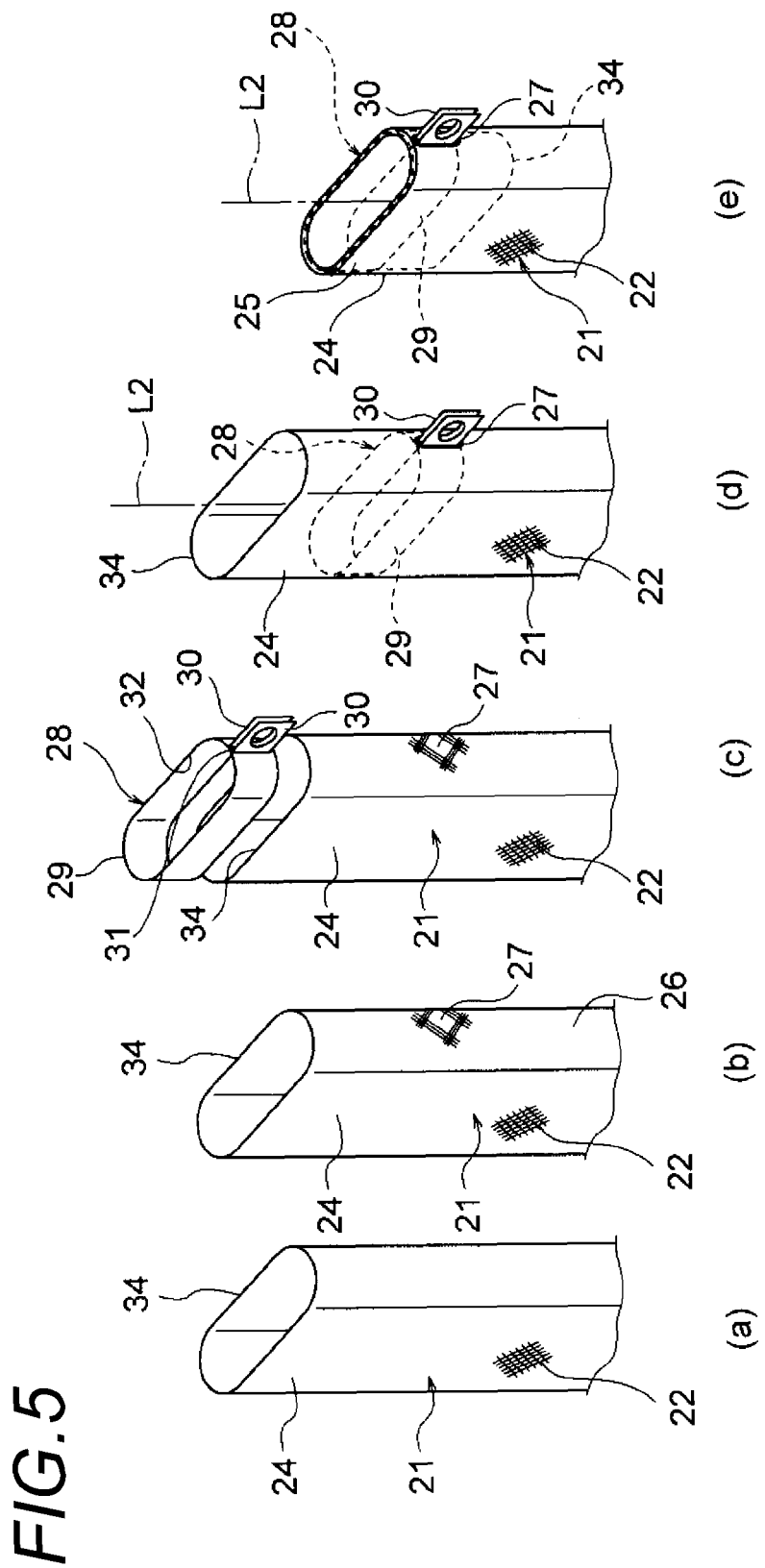
In FIG. 5, (a) to (e) are diagrams which show the process of forming a holding part at the terminal part of the shielding member (braid) and holding a clamping and fixing member.
Figure 6:
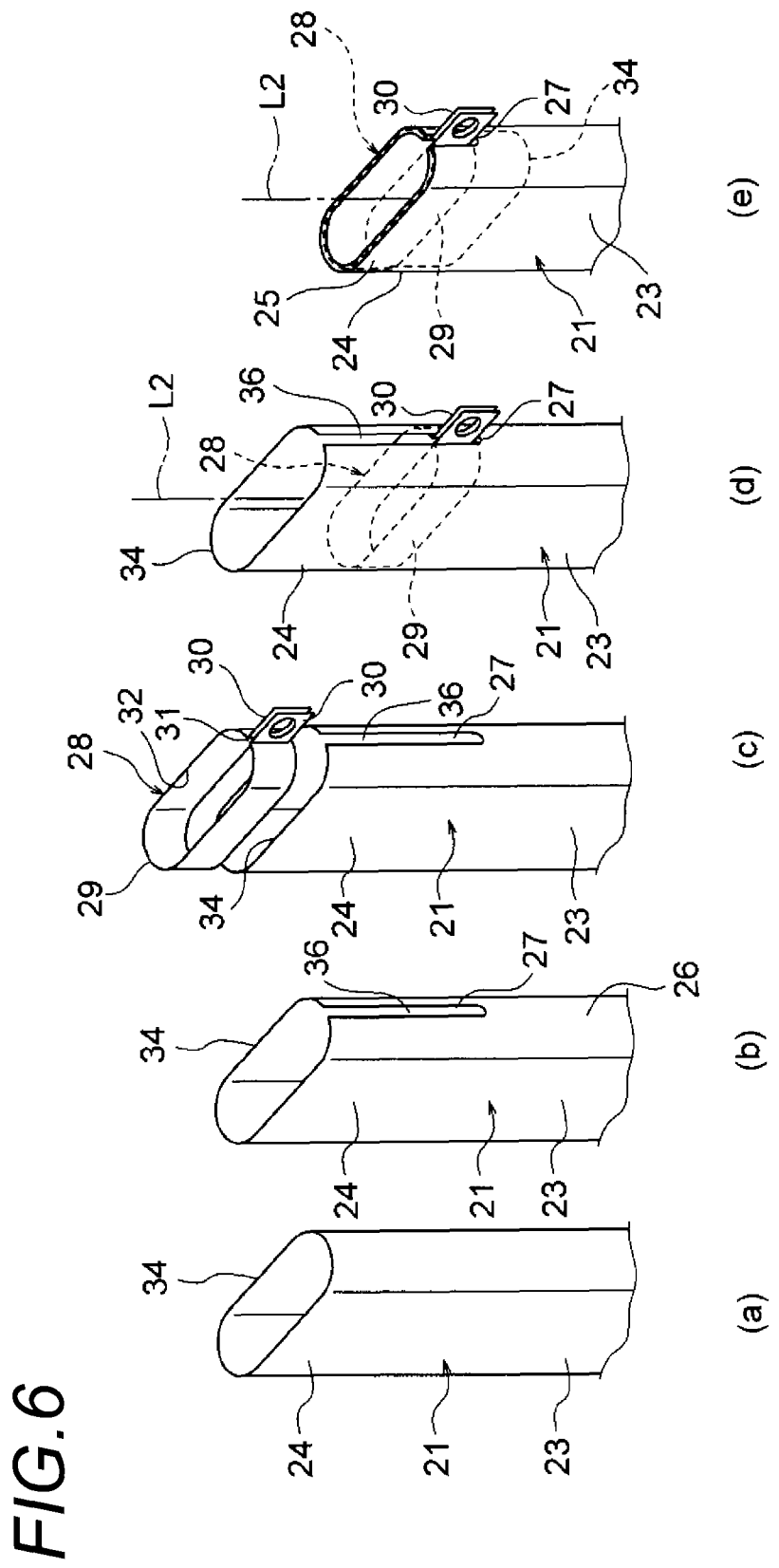
In FIG. 6, (a) to (e) are diagrams which show the process of forming a holding part at the terminal part of the shielding member (metal foil) and holding a clamping and fixing member.

The shielding member 21 may be formed of a braid 22 (refer to FIGS. 5(*a*) to 5(*e*)), or may be formed of a metal foil 23 (refer to FIGS. 6(*a*) to 6(*e*)). The material and the shape of the shielding member 21 are not particularly limited as long as the electromagnetic wave shielding measures can be taken and a holding part 25 can be formed at a terminal part 24.

The shielding member 21 is formed in a tubular shape which has an ellipse cross section. The shielding member 21 is so formed that the lengths of the shielding member 21 in the major axis direction and in the minor axis direction are slightly larger than those of the tubular part 15 of the shield casing 14.

The above-mentioned holding part 25 is formed by bending an end 34 in the terminal part 24 of the shielding member 21 in the direction of an axis L2 of the shielding member 21. In this embodiment, the holding part 25 is formed by bending inwards the end 34 to be described later (alternatively, the holding part 25 may be formed by bending the end 34 outwards). The holding part 25 is formed in a generally two-folded bag-like shape. The holding part 25 has an opening part 27 at one side part 26 in the major axis direction. The opening part 27 is so formed that fixing parts 30 to be described later can be protruded outwards from the inside.

The opening part 27 when the shielding member 21 is formed of the braid 22 (refer to FIGS. 5(a) to 5(e)) is slightly different in formation from that when the shielding member 21 is formed of the metal foil 23 (refer to FIGS. 6(a) to 6(e)).

A reference numeral 28 indicates a clamping and fixing member (fixing member). The clamping and fixing member 28 is a member which has conductivity, and is formed by forging a thin metal plate with elasticity. In particular, the clamping and fixing member 28 is formed by bending the above-mentioned thin metal plate while the above-mentioned thin metal plate is forged to a belt. The clamping and fixing member 28 has a terminal pressing part 29 and a pair of fixing parts 30. The terminal pressing part 29 is formed in a generally C-shaped form, as shown in FIGS. 5(c) and 6(c), as if a part of the tube which becomes an ellipse in a cross sectional view is split. A split part 31 is formed to be produced between two terminals of the terminal pressing part 29. The terminal pressing part 29 is formed in such a shape that the length in the minor axis direction is shortened especially, if an interval between the two terminals becomes shorter when the two terminals get closer. The inner surface of the terminal pressing part 29 is formed as a pressing surface 32.

The fixing parts 30 are coupled to the two terminals of the terminal pressing part 29, respectively. The pair of fixing parts 30 are arranged and formed to be opposite to each other at an interval in conformity with the split part 31. The pair of fixing parts 30 have the same rectangular flat plate shape, and have a bolt insertion through-hole 33 where a bolt is inserted in a central position.

Next, terminal processing procedures are described with reference to FIGS. 5(a) to 5(e). FIGS. 5(a) to 5(e) are diagrams which show terminal processing procedures when the shielding member 21 is formed of the braid 22.

In a first procedure shown in FIG. 5(a), the shielding member 21 is formed of the braid 22 in which very thin wires, which has conductivity, are braided in a tubular shape. The shielding member 21 is formed by cutting the braid 22 into a predetermined length in the longitudinal direction. In FIG. 5(a), with the above-mentioned cutting, the end 34 of the shielding member 21, in other words, the end 34 of the braid 22 is kept in a cut state (no additional processes although it is easy to get loose).

In a second procedure shown in FIG. 5(b), the opening part 27 of the shielding member 21 (braid 22) is formed at the side part 26. The opening part 27 is formed by widening a mesh at a predetermined position from the end 34. It is also possible to drill a hole by cutting off to form the opening part 27 besides widening a mesh. It is also possible to form a generally slit-like part (refer to the slit 36 to be described later, which is shown in FIG. 6(b)), which is extended from the end 34, by disentangling or cutting meshes, and to form the opening part 27 with this part. The opening part 27 is formed in conformity with the size of the fixing parts 30 in the clamping and fixing member 28.

In a third procedure shown in FIGS. 5(c) and 5(d), the clamping and fixing member 28 is mounted to the shielding member 21 (braid 22). In particular, the clamping and fixing member 28 is mounted by protruding the fixing parts 30 outwards from the inside of the opening part 27 while the terminal pressing part 29 is inserted inside the shielding member 21.

In a fourth procedure shown in FIG. 5(e), the holding part 25 is formed by bending the terminal part 24 of the shielding member 21 (braid 22) inwards to hide the end 34. Since the braid 22 becomes two-folded and generally bag-like with the forming of the holding part 25, and the pair of fixing parts 30 are caught in the opening part 27, the clamping and fixing member 28 is kept in an undropped state. The braid 22 overlaps with the pressing surface 32 of the terminal pressing part 29 with the forming of the holding part 25. After the terminal part 24 is bent inwards, if the terminal part 24 is fixed so that the two-folded part near the end 34 (bag mouth part which is formed at the mouth of the bag when the generally bag-like shape is formed) is partly or totally closed, it will become possible to prevent the dropping of the clamping and fixing member 28 more reliably. The closing methods may include welding such as seam welding or spot welding, contact bonding such as heat contact bonding, and the use of closing members (stapler), which are mentioned as preferable examples.

After the above terminal processing procedures, when the terminal part 24 of the shielding member 21 is inserted to the outside of the tubular part 15 of the shield casing 14, as shown in FIG. 3, and the pair of fixing parts 30, which are placed on the bolt fastening base 19, are clamped and fixed with a bolt 35, as shown in FIG. 4, the terminal part 24 of the shielding member 21 is pressed with the fixing so that the terminal pressing part 29 of the clamping and fixing member 28 is in a surface contact with the tubular part 15. Therefore, at the same time of clamping and fixing with the bolt 35, electric connection of the shielding member 21 is also completed.

Next, terminal processing procedures when the shielding member 21 is formed of the metal foil 23 are described with reference to FIGS. 6(a) to 6(e).

In a first procedure shown in FIG. 6(a), the shielding member 21 is formed by making the metal foil 23 which has conductivity in a tubular form, and cutting into a predetermined length in the longitudinal direction.

In a second procedure shown in FIG. 6(b), the opening part 27 of the shielding member 21 (metal foil 23) is formed at the side part 26. The opening part 27 is formed by cutting until a predetermined position from the end 34 (The slit 36 is formed, and a part of the slit 36 becomes the opening part 27. It is also possible to drill a hole by cutting off to form the opening part 27 besides forming the slit 36). The opening part 27 is formed in conformity with the size of the fixing parts 30 in the clamping and fixing member 28.

In a third procedure shown in FIGS. 6(c) and 6(d), the clamping and fixing member 28 is mounted to the shielding member 21 (metal foil 23). In particular, the clamping and fixing member 28 is mounted by protruding the fixing parts 30 outwards from the inside of the opening part 27 while the terminal pressing part 29 is inserted inside the shielding member 21.

In a fourth procedure shown in FIG. 6(e), the holding part 25 is formed by bending the terminal part 24 of the shielding member 21 (metal foil 23) inwards to hide the end 34. Since the metal foil 23 becomes two-folded and generally bag-like with the forming of the holding part 25, and the pair of fixing parts 30 are caught in the opening part 27, the clamping and fixing member 28 is kept in an undropped state. The metal foil 23 overlaps with the pressing surface 32 of the terminal pressing part 29 with the forming of the holding part 25. After the terminal part 24 is bent inwards, if the terminal part 24 is fixed so that the two-folded part near the end 34 (bag mouth part which is formed at the mouth of the bag when the generally bag-like shape is formed) is partly or totally closed, it will become possible to prevent the dropping of the clamping and fixing member 28 more reliably. The closing methods may include adhesion with adhesive and the use of closing members (stapler or tape), which are mentioned as preferable examples.

After the above terminal processing procedures, when the terminal part 24 of the shielding member 21 is inserted to the outside of the tubular part 15 of the shield casing 14, as shown in FIG. 3, and the pair of fixing parts 30, which are placed on the bolt fastening base 19, are clamped and fixed with a bolt 35, as shown in FIG. 4, the terminal part 24 of the shielding member 21 is pressed with the fixing so that the terminal pressing part 29 of the clamping and fixing member 28 is in a surface contact with the tubular part 15. Therefore, at the same time of clamping and fixing with the bolt 35, electric connection of the shielding member 21 is also completed.

According to the second embodiment, an effect is achieved that a shield terminal connection structure and a shield terminal connecting method which are simple can be provided, in order to connect the terminal part 24 of the shielding member 21 to the shield casing 14. Therefore, an effect is achieved that the problems of the related art example are solved. That is, in the related art example, as shown in FIG. 8, the terminal part of the braid 1 is inserted into the predetermined position of the shielding shell 5, the shielding shell 5 is pressed with the crimping of the crimp ring 6, and then the shielding shell 5 is fixed to the shield casing 3. Therefore, in the connecting of the braid 1, there is a problem that the connecting is time-consuming, and there is a problem that the number of components is large. However, according to the present invention, it can be found from the description of FIGS. 3 to 6(e), since the shield terminal connection structure and the shield terminal connecting method are simple, an effect is achieved that the above-mentioned problems can be solved.

Third Embodiment

Figure 7:
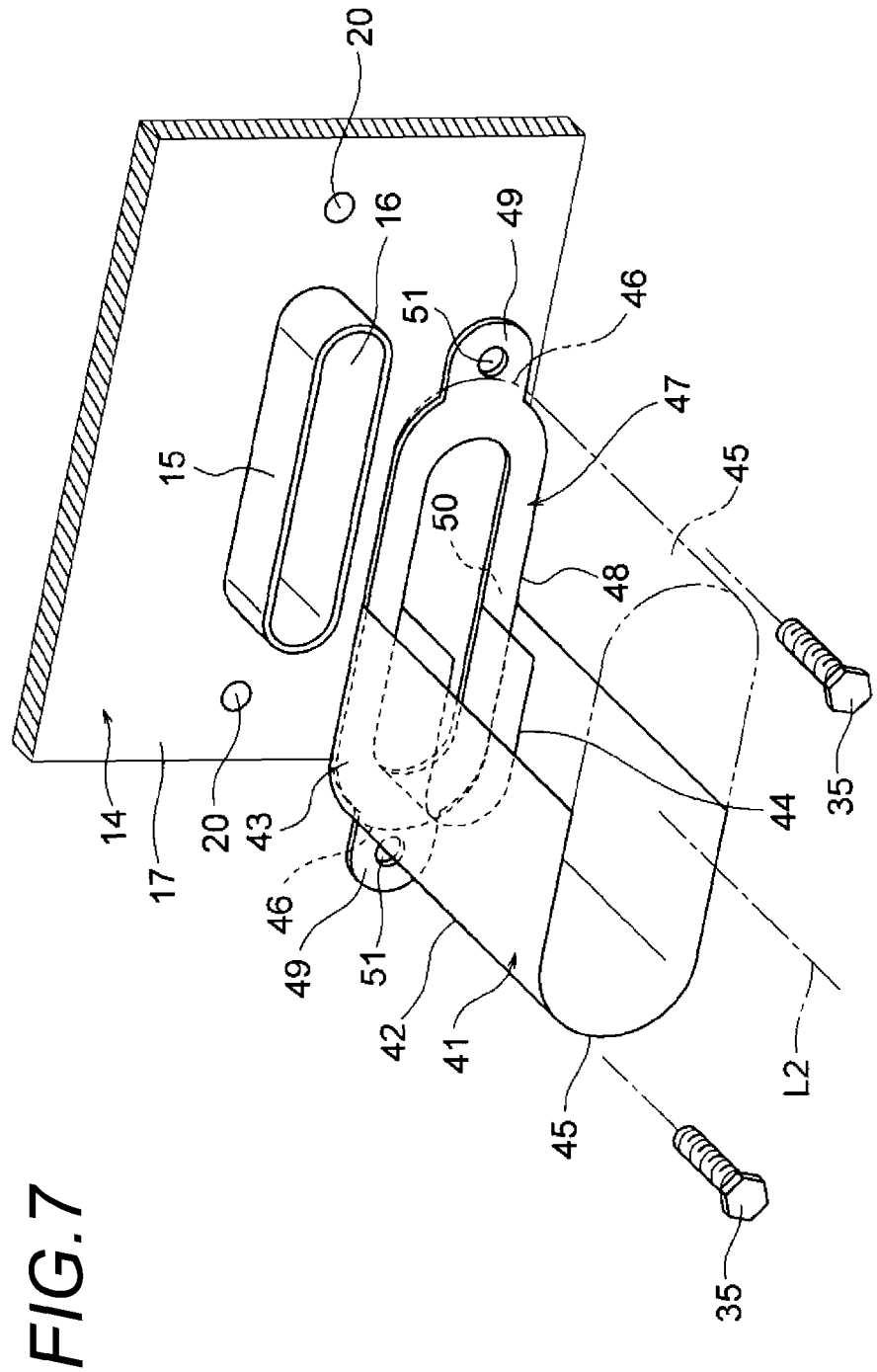
FIG. 7 is a diagram which shows another example of a shield terminal connection structure according to the present invention, and is an exploded perspective view of a terminal part of a shielding member and a shield casing (a third embodiment).

Next, a third embodiment is described with reference to the figures. FIG. 7 is a diagram which shows another example of a shield terminal connection structure according to the present invention, and is an exploded perspective view of a terminal part of a shielding member and a shield casing.

In FIG. 7, a reference numeral 41 indicates a shielding member. The shielding member 41 is formed in a tubular shape with which the three conduction paths 11 (refer to FIGS. 1 and 3) can be covered collectively. The shielding member 41 is a member for taking electromagnetic wave shielding measures, and is formed so that a substantially overall length of the conduction path 11 can be covered. The shielding member 41 may be formed of a braid, or may be formed of a metal foil. The material and the shape of the shielding member 41 are not particularly limited as long as the electromagnetic wave shielding measures can be taken and a holding part 43 can be formed at a terminal part 42.

The shielding member 41 is formed in a tubular shape which has an ellipse cross section. The shielding member 41 is so formed that the lengths of the shielding member 41 in the major axis direction and in the minor axis direction are slightly larger than those of the tubular part 15 of the shield casing 14. In the third embodiment, the bolt fastening base 19 (refer to FIG. 3) does not exist on the shield casing 14, but bolt holes 20 are separately formed on one side wall 17.

The above-mentioned holding part 43 is formed by bending an end 34 in the terminal part 42 of the shielding member 41 in the direction of an axis L2 of the shielding member 41. In this third embodiment, the holding part 43 is formed by bending the end 34 inwards (alternatively, the holding part 43 may be formed by bending the end 68 outwards). The holding part 43 is formed in a generally two-folded bag-like shape (similar to the holding part 25 of the second embodiment). The holding part 43 has opening parts 46 at side parts 45 in the major axis direction. The opening parts 46 are so formed that fixing parts 49 to be described later can be protruded outwards from the inside.

The opening parts 46 when the shielding member 41 is formed of a braid are slightly different in form from those when the shielding member 41 is formed of a metal foil (formed similarly to the opening part 27 of the second embodiment).

A reference numeral 47 indicates a clamping and fixing member (fixing member). The clamping and fixing member 47 is a member which has conductivity, and is formed by punching a thin metal plate as shown in the figure. The clamping and fixing member 47 has a terminal pressing part 48 and a pair of fixing parts 49. The terminal pressing part 48 is formed in an annular plate shape which is an ellipse when viewed from top. The inner surface (a surface which faces the shield casing 14) of the terminal pressing part 48 is formed as a pressing surface 50.

The fixing parts 49 are coupled to the two side parts of the terminal pressing part 48 in the major axis direction, respectively. The pair of fixing parts 49 have a bolt insertion through-hole 51 where a bolt is inserted. The pair of fixing parts 49 are arranged and formed in conformity with the positions of the bolt holes 20 of the shield casing 14.

In FIG. 7, the clamping and fixing member 47 is mounted to the shielding member 41. In particular, the clamping and fixing member 47 is mounted by protruding the fixing parts 49 outwards from the inside of the opening parts 46 while the terminal pressing part 48 is inserted inside the shielding member 41.

The holding part 43 is formed by bending the terminal part 42 of the shielding member 41 inwards to hide the end 34. The clamping and fixing member 47 is held in an undropped state with the forming of the holding part 43. After the terminal part 42 is bent inwards, if the terminal part 42 is fixed so that the two-folded part near the end 34 (bag mouth part) is partly or totally closed, it will become possible to prevent the dropping of the clamping and fixing member 47 more reliably. The closing methods are the same as those in the embodiments 1 and 2.

After the above terminal processing procedures, when the terminal part 42 of the shielding member 41 is inserted to the outside of the tubular part 15 of the shield casing 14, and the pair of fixing parts 49 are clamped and fixed with bolts 35, the terminal part 42 of the shielding member 41 is pressed with the fixing so that the terminal pressing part 48 of the clamping and fixing member 47 is in a surface contact with the side wall 17 of the shield casing 14. Therefore, at the same time of clamping and fixing with the bolts 35, electric connection of the shielding member 41 is also completed.

It is needless to say that the same effects as those in the second embodiment or the first embodiment are achieved in the third embodiment.

The shield terminal connection structures and methods according to the present invention are described in detail with reference to the specific embodiments, but the invention is not limited to the previously described embodiments, and besides, it is apparent that various modifications can be made without changing the purpose of the invention.

In the above description, the shield structure is the shield casing 14 or the shield casing 61, but the shield structure is not limited to these. For example, the shield structure may be a panel member or the like, which can serve as a ground.

The present application is based on the Japanese patent application (patent application No. 2010-132585) filed on Jun. 10, 2010, the contents of which are incorporated herein by reference.

INDUSTRIAL APPLICABILITY

According to the shield terminal connection structures and methods of the present invention, what is necessary is just to use the holding part which the terminal part itself forms and the conductive fixing member which is held to the holding part, when the terminal part of the shielding member is connected to the shield structure. When the fixing member is fixed to the shield structure, the terminal part of the shielding member will be electrically connected to the shield structure via the fixing member with this fixing. Thus, an effect is achieved that the simple shield terminal connection structures and methods for connecting the terminal part of the shielding member to the shield structure can be provided.

REFERENCE SIGNS LIST

11: conduction path
12: insulative wire core
13: terminal
61: shield casing (shield structure)
62: hole
63: one side wall
64: bolt hole
65: shielding member
66: terminal part
67: holding part
68: end
69: side part
70: slit
71: fixing member
72: ceiling wall
73: side wall
74: held part
75: first penetrated held part
76: second penetrated held part
77: bridge part
78: frame part
79: bolt detent
80: bolt insertion through-hole
81: bolt

The invention claimed is:

1. A shield terminal connection structure, comprising:
a terminal part of a tubular shielding member which accommodates a plurality of conduction paths collectively, the terminal part itself forming a holding part; and
a conductive fixing member which is fixed to a shield structure of a connection party to which the conduction paths are connected, wherein the conductive fixing member is electrically contacted with and held to the holding part by the holding part,
wherein the holding part is formed by bending the terminal part in an axial direction of the tubular shielding member, and
the terminal part is bent around an inner fixing member and a portion of the inner fixing member protrudes through the tubular shielding member and is fixed to the conductive fixing member by a fastener.

2. The shield terminal connection structure according to claim 1, wherein
the terminal part is bent inwards.

3. The shield terminal connection structure according to claim 1, wherein
the holding part is formed by bending the terminal part in a generally bag-like shape and fixing the terminal part so that a bag mouth part of the generally bag-like shape is partly or totally closed.

4. The shield terminal connection structure according to claim 1, wherein the terminal part is unitary with the tubular shielding member.

5. The shield terminal connection structure according to claim 1, wherein the conductive fixing member includes a body and a fixing part which is extended from the body and fixed to the shield structure of the connection party, and a part of the body of the conductive fixing member is held by the holding part.

6. The shield terminal connection structure according to claim 5, wherein the holding part is formed by bending the terminal in an axial direction of the shielding member thereby to form an inner holding part and an outer holding part, and the part of the body of the conductive fixing member is held between the inner holding part and the outer holding part.

7. The shield terminal connection structure according to claim 6, wherein a first through hole is formed in the body of the conductive fixing member, and the inner holding part passes through the first through hole.

8. The shield terminal connection structure according to claim 7, wherein a second through hole is formed in the body of the conductive fixing member, and the outer holding part passes through the second through hole.

9. The shield terminal connection structure according to claim 1, wherein each conduction path of the plurality of conduction paths is individually insulated.

10. A shield terminal connection method, comprising:
forming a holding part with a terminal part itself of a tubular shielding member which accommodates a plurality of conduction paths;
causing a conductive fixing member to be electrically contacted with and held to the holding part by the holding part; and then,
fixing the conductive fixing member to a shield structure of a connection party to which the conduction paths are connected,
wherein the holding part is formed by bending the terminal part in an axial direction of the tubular shielding member, and
the terminal part is bent around an inner fixing member and a portion of the inner fixing member protrudes through the tubular shielding member and is fixed to the conductive fixing member by a fastener.

11. A shield terminal connection structure, comprising:
a terminal part of a tubular shielding member which accommodates a plurality of conduction paths collectively, the terminal part itself forming a holding part; and
a conductive fixing member which is fixed to a shield structure of a connection party to which the conduction paths are connected, wherein the conductive fixing member is electrically contacted with and held to the holding part, wherein the conductive fixing member includes a body and a fixing part which is extended from the body and fixed to the shield structure of the connection party, and a part of the body of the conductive fixing member is held by the holding part, and the holding part is formed by bending the terminal part in an axial direction of the shielding member thereby to form an inner holding part and an outer holding part, and the part of the body of the conductive fixing member is held between the inner holding part and the outer holding part, and the fixing part of the conductive fixing member protrudes through the tubular shielding member.

12. The shield terminal connection structure according to claim 11, wherein the holding part is formed by bending the terminal part into an inside of the tubular part.

13. A shield terminal connection method, comprising:

forming a holding part with a terminal part itself of a tubular shielding member which accommodates a plurality of conduction paths;

causing a conductive fixing member to be electrically contacted with and held to the holding part by the holding part; and then, fixing the conductive fixing member to a shield structure of a connection party to which the conduction paths are connected, wherein the conductive fixing member includes a body and a fixing part which is extended from the body and fixed to the shield structure of the connection party, and a part of the body of the conductive fixing member is held by the holding part, and the holding part is formed by bending the terminal in an axial direction of the shielding member thereby to form an inner holding part and an outer holding part, and the part of the body of the conductive fixing member is held between the inner holding part and the outer holding part, and the fixing part of the conductive fixing member protrudes through the tubular shielding member.

14. A shield terminal connection structure, comprising:

a terminal part of a tubular shielding member which accommodates a plurality of conduction paths collectively, the terminal part itself forming a holding part; and a conductive fixing member which is fixed to a shield structure of a connection party to which the conduction paths are connected, wherein the conductive fixing member is electrically contacted with and held to the holding part by the holding part, wherein the holding part is inserted into slots of the conductive fixing member.

15. A shield terminal connection method, comprising:

forming a holding part with a terminal part itself of a tubular shielding member which accommodates a plurality of conduction paths;

causing a conductive fixing member to be electrically contacted with and held to the holding part by the holding part; and then, fixing the conductive fixing member to a shield structure of a connection party to which the conduction paths are connected, inserting the holding part into slots of the conductive fixing member.

* * * * *